United States Patent
Hillebrands et al.

(10) Patent No.: US 6,674,662 B1
(45) Date of Patent: Jan. 6, 2004

(54) MAGNETORESISTIVE RANDOM ACCESS MEMORY AND METHOD FOR READING/WRITING DIGITAL INFORMATION TO SUCH A MEMORY

(76) Inventors: Burkard Hillebrands, Kaiserslautern (DE); Robert Leon Stamps, Leederville (AU)

( * ) Notice: Subject to any disclaimer, the term of this patent is extended or adjusted under 35 U.S.C. 154(b) by 0 days.

(21) Appl. No.: 09/701,521

(22) PCT Filed: May 27, 1999

(86) PCT No.: PCT/EP99/03668
§ 371 (c)(1),
(2), (4) Date: Feb. 12, 2002

(87) PCT Pub. No.: WO99/62069
PCT Pub. Date: Dec. 2, 1999

(30) Foreign Application Priority Data

May 28, 1998 (DE) .......................................... 198 23 826

(51) Int. Cl.⁷ ............................................... G11C 11/00

(52) U.S. Cl. .................. 365/158; 365/171; 365/173

(58) Field of Search ............................... 365/158, 171, 365/173

(56) References Cited

U.S. PATENT DOCUMENTS

| | | | |
|---|---|---|---|
| 5,276,639 A | 1/1994 | Inoue | 365/162 |
| 5,343,422 A | 8/1994 | Kung et al. | 365/173 |
| 5,448,515 A | 9/1995 | Fukami et al. | 365/171 |
| 5,650,958 A | 7/1997 | Gallagher et al. | 365/173 |
| 5,703,805 A | 12/1997 | Tehrani et al. | 365/173 |
| 5,768,181 A | * 6/1998 | Zhu et al. | 365/158 |
| 5,978,257 A | * 11/1999 | Zhu et al. | 365/173 |
| 6,577,529 B1 | * 6/2003 | Sharma et al. | 365/158 |

FOREIGN PATENT DOCUMENTS

| | | |
|---|---|---|
| DE | 195 34 856 | 3/1997 |
| DE | 197 17 123 | 11/1997 |
| EP | 0 614 192 | 11/1993 |
| EP | 0 759 619 | 2/1997 |
| WO | WO 95/10112 | 4/1995 |
| WO | WO 96/25740 | 8/1996 |

OTHER PUBLICATIONS

"High Density Pseudo Spin Valve Magnetoresistive RAM" by Tehrani et al., IEEE, 1998, pps. 43–46.

"Size Dependence of Switching Thresholds for Pseudo Spin Valve MRAM Cells" by B.A. Everitt, Apr. 15, 1997, J. Appl. Phys., pps. 4020–4022.

"Giant Magnetoresistance of (001) Fe/(001) Cr Magnetic Superlattices" by M.N. Balbich et al., Physics Review Letters, vol. 61, No. 21, Nov. 21, 1988.

"Large Magnetoresistance of Field–Induced Giant Ferrimagnetic Multilayers" by Teruya Shinjo et al., Journal of the Physical Society of Japan, vol. 59, No. 9, Sep. 1990.

* cited by examiner

Primary Examiner—Anh Phung
(74) Attorney, Agent, or Firm—Ohlandt, Greeley, Ruggiero & Perle LLP

(57) ABSTRACT

A digital magnetic memory cell device for read and/or write operations having a first and a second magnetic layer, the magnetization of which is oriented parallel or antiparallel for the storage of digital information. An intermediate layer is disposed between the first and second magnetic layers. A pair of intersecting conductors are disposed to switch the magnetization of at least one of the two magnetic layers in a memory cell defined by the intersection thereof when a read or a write current is applied thereto. The conductors intersect at an angle β so that current pulses having a pulse duration <10 ns make it possible to switch the magnetization of a cell fully and securely from a parallel to an antiparallel orientation and vice versa.

22 Claims, 16 Drawing Sheets

MAGNETORESISTIVE RANDOM ACCESS MEMORY AND METHOD FOR READING/WRITING DIGITAL INFORMATION TO SUCH A MEMORY

FIELD OF THE INVENTION

The invention concerns a digital magnetic memory cell device for reading and/or writing operations with a first and a second magnetic layer, whose magnetizations are aligned parallel or antiparallel to one another for storing digital information, whereby at least one of the magnetic layers has a magnetic anisotropy as well as a method for the reading/writing of digital information to a digital memory cell device In addition, a digital memory device comprising a multiple number of memory cell devices and a method for reading/writing digital information to such a digital memory device is disclosed.

DESCRIPTION OF THE RELATED ART

Currently, a multiple number of magnetic memories with freely selectable access (MRAM) have been developed.

An MRAM comprises a multiple number of magnetic memory cell devices. Each memory cell device comprises at least two magnetic layers, which are separated by an intermediate layer. The two magnetic layers may be magnetized parallel or antiparallel to one another. The two aforementioned states represent each time one bit of information, i.e., the logical zero ("0") or one ("1") state. If the relative orientation of the magnetization of the two layers is changed from parallel to antiparallel or vice versa, then the magnetoresistance typically changes by a few percent. This change in the resistance may be used for the readout from the memory cell of stored digital information. The change of cell resistance may be recognized by a voltage or current change, depending on wiring. For example, in the case of a voltage increase, the cell with a logical zero ("0") can be validated and in the case of a voltage decrease, the cell with a logical one ("1") can be validated.

Magnetic memory cells, which use the magnetoresistance effect for storage of digital information, have been made known from a plurality of publications.

Refer to the following in this regard:

EP 0 614,192

U.S. Pat. No. 5,343,422

EP 0 685,849

EP 0 759,619

U.S. Pat. No. 5,448,515

U.S. Pat. No. 5,276,639

U.S. Pat. No. 5,650,958

Particularly large increases in resistance in the range of several percent have been observed when the magnetization alignment changed from parallel to antiparallel and vice versa in cell structures with a giant magnetoresistance effect (GMR) or the tunnel magnetoresistance effect. Such cell structures are made known, for example, from M. N. Balbich, J. M. Broto, A. Fert, F. Nguyen Van Dau, F. Petroff, P. Eitenne, G. Creuzet, A. Freiderich and J. Chazelas "Giant Magnetoresistance of (001)Fe/(001) Cr Magnetic Superlattices", Physical Review Letters, Vol. 61, No. 21, p. 2472 ff. and Teruya Shinjo, Hidefumi Yamamoto "Large Magnetoresistance of Field-Induced Giant Ferrimagnetic Multilayers", Journal of the Physical Society of Japan, Vol. 59, No. 9, pp. 3061–3064;

WO 95/10112

WO 96/25740

EP 0 759,619 and

DE 197 17,123

An important advantage of magnetic memory cells, as described above, can be seen from the fact that the information is stored persistently in this type and manner, for example, in contrast to conventional semiconductor memories, and consequently after turning off the device in which the memory cells are used, and then again turning it on, the stored information is immediately available. In addition, storage media that are very resistant to radiation or "radiation-fast" are obtained.

A digital memory device for reading and/or writing operations has been made known from DE 195 34,856, which has a first magnetic layer and a second magnetic layer as well as a separating layer lying in between for conducting the read and/or write currents, whereby a directional change of the magnetization in one or both layers is effected, lasting over the time interval of the flowing current. The disclosure content of DE 195 34,856 with respect to a digital memory device according to the prior art is taken up to the full extent in the disclosure content of the present application.

A disadvantage of the digital memory device according to DE 195 34,856 is the fact that the addressing of the memory cell or individual memory cells of a memory cell matrix in an MRAM arrangement is conducted only by the position of the memory cell. This process is in no way optimal in regard to the time durations, particularly short or ultra-short time durations; in the case of several sequentially connected memory cells, the problem arises, in particular, that the coercive fields of the individual MRAM memory cells have a certain scatter as a result of irregularities, for example pinning centers.

As a result of this, it happens that not only is the desired memory cell addressed at the point of intersection but, rather, adjacent cells are also addressed, especially in the case of combining a plurality of the memory cell devices, which are known from DE 195 34,856, to give a memory device, e.g. in matrix form.

A magnetic memory device has become known from U.S. Pat. No. 5,448,515 that comprises a plurality of memory cells by means of which information can be a written into and read from the addressed memory cells as a result of remagnetization with the help of current pulses.

A disadvantage of this memory device was that writing in took place via currents or current pulses of unspecified time duration and the writing and reading conductors constantly enclosed an angle of 90°.

The memory device that is known from U.S. Pat. No. 5,276,639 is a superconducting magnetic memory device. In the case of this magnetic memory device, likewise, current pulses with a long duration of more than 15 ns are transformed for the purpose of writing in and reading out.

A digital magnetic memory cell device has become known from

EVERITT B A ET AL.: "SIZE DEPENDENCE OF SWITCHING THRESHOLDS FOR PSEUDO SPIN VALVE MRAM CELLS", JOURNAL OF APPLIED PHYSICS, Vol. 81, No. 8, PART 02A, Apr. 15,1997 (1997-04-15), pages 4020–4022, XP000702728 ISSN: 0021-8979 whereby this device has a first and a second magnetic layer, an intermediate layer, two intersecting printed conductors as well as means for reversing the magnetization. The memory cell device that has become known from Everitt B. A. et al. (loc. cit.) operates via bit switching times of the order of magnitude of 1 ns. However, no data are given regarding the length of the current pulses.

BRIEF SUMMARY OF THE INVENTION

The object of the invention is to avoid the disadvantages of the prior art that are described above and, in particular, to indicate a magnetic memory cell device in the case of which the reversing process both with respect to time as well as also with respect to the selection of the respective cells, i.e., very short switching times may also be realized. In particular, a secure and rapid switching of the addressed cells will be obtained with the combination of a multiple number of memory cells or memory cell devices into one digital memory unit, for example in matrix form or in the form of an array, even if the material properties fluctuate from cell to cell within the tolerance framework.

Another aspect of the invention is the indication of a method for optimized reversing of such a memory cell device. In addition, the invention aims at minimizing the power consumption necessary for reversing and thus minimizes the heat losses discharged from a module.

The object is resolved according to the invention by the fact that in a digital magnetic memory cell device according to claim 1, the reversal means comprise devices for producing currents and/or current pulses on a first and a second printed conductor of at least two intersecting printed conductors, wherein the printed conductors intersect at a predetermined angle, so that a complete and reliable reversal of the magnetization from a parallel to an antiparallel alignment is achieved with current pulses of a time duration of <10 ns in the intersection region in the memory cell device.

If clock times of 10 ns corresponding to 100 MHz and faster are aimed at for MRAM memories, then the length of a field pulse for writing in digital information, for example, amounts to a maximum of 5 ns. Even with such short pulse durations, a stable switching must also be obtained in the case of writing processes directly following one another. The method of the invention makes available a rapid switching of MRAM memory cells, which satisfies the conditions:

(i) high stability of the switching process against fluctuations of material and pulse parameters, (ii) high insensitivity to undesired switching of adjacent cells and of cells under the address lines, (iii) high stability of the switching process even in the case of directly sequential switching processes of an individual cell, and (iv) rapid switching times.

If a magnetic field is applied to a memory cell, then the direction of the magnetization shows precession over the direction of the field acting in the layer.

It is to the merit of the inventor to have made known the following for solving the object of the invention:

If the duration of the magnetic field pulse applied for switching is too long, i.e., typically longer than 5 ns, then very many precession reversals occur during the application of the switching pulse, and the switching is determined by dissipative mechanisms, described by an attenuation constant $\alpha$. The Zeeman energy introduced by applying the external field is energetically dissipated by an attenuation mechanism.

If the pulse length is short, typically shorter than 5 ns, the remagnetization behavior is essentially more intensely determined by the precession behavior of the magnetization, and with a further decreasing pulse length, this tendency is even stronger. The precession is barely attenuated up to the end of the field pulse, and the direction of magnetization as well as the content of the information written in depends to a great extent in which direction the magnetization lies at the end of the applied field pulse, so that the memory cell devices known from the prior art and read/write operations do not have stable switching behavior, particularly in the case of fluctuating material and pulse parameters.

The switching process in a magnetic memory cell can be described by the Gilbert form of the Landau-Lifschitz equation:

$$\frac{\partial \vec{M}}{\partial t} = -\gamma \vec{M} \times \vec{H}_{eff} + \frac{\alpha}{M_s} \vec{M} \times \frac{\partial \vec{M}}{\partial t} \qquad (1)$$

Reference is made in this regard, for example, to T. L. Gilbert, Phys. Rev. 100, 1243 (1955), whereby the disclosure content of thus article is included to the full extent in the present application.

The first term on the right side of equation (1) describes the precession of the magnetization, and the second term describes the attenuation, wherein $\alpha$ is a phenomenological attenuation parameter.

The effective field $\vec{H}_{eff}$ is defined by the sum of all fields, which act on the magnetization:

$$\vec{H}_{eff} + \vec{H}_{ext} + \vec{H}_{ani} + \vec{H}_{shape} \qquad (2)$$

$$\vec{H}_{ani} + |\vec{H}_{ani}| \frac{M_x}{M_s} \vec{x} \qquad (3)$$

$$\vec{H}_{shape} = -(4\pi N_x M_x \hat{x} + 4\pi N_y M_y \hat{y} + 4\pi N_z M_z \hat{z}) \qquad (4)$$

whereby $\vec{H}_{ext}$: externally applied pulse field $\vec{H}_{ani}$: is the maximum anisotropic field, whereby in the present analysis, the facilitated axis of magnetization lies in the x direction $N_i$ (i=x, y, z) are the diagonal elements of the demagnetization tensor in diagonal form.

$M_x$, $M_y$, $M_z$ are the components of the magnetization vector in the x, y and z directions.

Solutions to equation (1) can be found, for example, by means of a Runge-Kutta algorithm, as is described in J. R. Dormand, P. J. Prince, J. Computat and Appl. Mat. 7, 67 (1981), whose disclosure content is taken up to the full extent in the present application.

By appropriate selection of the ratio of currents in the two current-bearing conductors as well as the pulse durations, a predetermined angle $\theta$ of the magnetic field can be set beforehand opposite the facilitated direction of the magnetization. If the pulse duration and the angle $\theta$ are set, as described later on, then stable and complete reversing of the memory cells is achieved even in the case of very short switching pulses of <10 ns, and particularly of <5 ns.

In a particularly advantageous configuration of the invention, the pulse durations are selected such that the complete reversal is achieved simultaneously with minimum power consumption.

In a first form of embodiment of the invention, unipolar pulses with a specific pulse duration are applied to the conductors.

In a second form of embodiment, instead of unipolar pulses on the two conductors, bipolar pulses are applied to one conductor and a static current or current pulse is applied to the other printed conductor. The bipolar pulse is tuned precisely to the reversing time of the memory cell device in the length of the first half-wave and couples resonantly to the reversal of magnetization. It is applied to the writing conductor, in which a magnetic field is produced perpendicular to the facilitated direction of magnetization in the layer to be reversed. A static current or a current pulse, whose length is longer than the half-wave time of the bipolar pulse, is applied to the other printed conductor. This produces a magnetic field perpendicular to the reversing field. In a particularly simple configuration, the printed conductors are arranged such that they are perpendicular to one another in the memory cell device, i.e., they intersect at a right angle.

Other angles $\beta \neq 90°$ at which the printed conductors intersect are also possible. For example, it may be advantageously provided for specific pulse durations that the printed conductors run parallel at least on a partial segment, i.e., $\beta=0°$ or one of the two printed conductors runs diagonally over the memory matrix, i.e., $\beta \approx 45°$.

The magnetic anisotropy of the layers, the basis for the formation of a direction of facilitated magnetization is preferably obtained by means of incremental processes and/or a shape anisotropy, for example, an ellipsoid edging of the layers. It is particularly preferred if the magnetization must be reversed only in one layer, whereas it is retained in the other layer, also with switching pulses. Such behavior is achieved by the fact that in a further enhanced form of embodiment of the invention, one of the two magnetic layers is magnetically harder than the other, for example, due to the fact that one of the layers is thicker than the other layer, or one of the layers has contact with an antiferromagnetic layer. In a particularly simple configuration of the invention, one of the printed conductors lies parallel to the direction of facilitated magnetization in the intersecting region.

In addition to the above-described memory cell device, the invention also makes available a method for writing digital information to such a memory cell device. The method according to the invention is characterized by the fact that currents and/or current pulses with a pulse duration of <10 ns are applied onto the two printed conductors, so that in the intersecting region of the printed conductors a magnetic field at an angle θ opposite to the direction of facilitated magnetization is built up by the current pulses, whereby the relative orientation of the magnetization can be changed and thus information can be written into a memory cell.

In a first form of embodiment of the invention, the current pulses can be unipolar current pulses. In a second enhanced form of embodiment, the current pulse, which is applied to the printed conductor, at which the current flux produces a magnetic field perpendicular to the direction of facilitated magnetization is a bipolar current pulse and a current or current pulse is preferably applied on the other printed conductor with a time duration, which is longer than the half-wave duration of the bipolar current pulse. The half-wave duration preferably amounts to less than 10 ns.

In an advantageous form of embodiment, it is provided to undertake the setting of angle θ to the direction of facilitated magnetization by selection of the ratio of current intensities of the current pulses to one another.

The memory cell device according to the invention is part of a digital memory device with a multiple number of such memory cell devices in a preferred form of embodiment. Each of the memory cell devices has at least two intersecting printed conductors. Preferably, the memory cell devices can be applied as an array in matrix form.

In one form of embodiment of the invention, common reversing means are assigned to a multiple number of printed conductors arranged in rows or columns.

In a particularly simple form of embodiment, the magnetically harder layer of the individual memory cell devices can be extended out over several cells.

In such a digital memory device, the method according to the invention for remagnetizing a memory cell device can be applied with special advantage. In particular, such a process makes possible a precise addressing of the individual memory cells of the matrix on the basis of a selection of those memory cells by means of a time scale, in which the resulting field pulse is applied at an angle θ, which is exactly the case in the intersecting region of two intersecting current-bearing conductors. Remagnetization is then produced by a rotation of the magnetization from the antiparallel to the parallel alignment or orientation or vice versa. In the case of short switching times according to the invention, the angle θ at which the switching magnetic field is applied, is of decisive importance, since the precession is hardly attenuated up to the end of the field pulse and the Zeeman energy introduced into the system by applying the field pulse, in order to achieve a stable switching, must again be taken from the system in the form of Zeeman energy. If this is maintained, then only the cells lying in the intersecting region of the current-conducting conductors are selected with the method of the invention, based on the pulse duration and, as the case may be, the current intensity, i.e., the reversing is produced without influencing the adjacent cells. These latter cells maintain their magnetization despite the switching pulses. Fluctuations of the pulse width or duration and of material properties clearly have a smaller influence on the stability of switching.

BRIEF DESCRIPTION OF THE DRAWINGS

The invention will now be described in more detail below on the basis of the figures and examples of embodiment. Here:

FIG. 1 shows a digital memory cell device according to the invention in section (FIG. 1a) and in a top view (FIG. 1b).

Figure 1A:
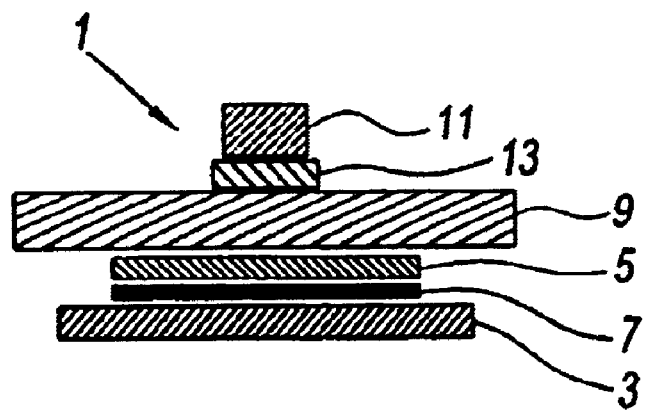
FIG. 1a shows a section through a memory cell device according to the invention.

A digital magnetic memory cell device for read and/or write operations having a first and a second magnetic layer, the magnetization of which is oriented parallel or antiparallel for the storage of digital information. An Intermediate layer is disposed between the first and second magnetic layers. a pair of intersecting conductors are disposed to switch the magnetization of at least one of the two magnetic layers in a memory cell defined by the intersection therof when a read or a write current is applied thereto. The conductors intersect at an angle β so that current pulses having a pulse duration <10 ns make it possible to switch the magnetization of a cell fully and securely from a parallel to an antiparallel orientation and vice aversa.

The digital memory cell device according to the invention comprises a first magnetic layer 3 as well as a second magnetic layer 5 with non-magnetic separating layer 7 lying in between. Both the first magnetic layer as well as he second magnetic layer essentially involve permanent or ferromagnetic layers. Preferred layer structures are, for example, Co—Cu—Co or Fe—Cr—Fe or Fe—Cr—Fe or NiFe—Cu—NiFe layer systems comprising the first magnetic layer 3, the non-magnetic intermediate layer 7, as well as the second magnetic layer 5. These systems are designated as GMR systems. Magnetic tunnel systems, which may have, for example, the following layer structures:

Co—Al$_2$O$_3$—NiFe

NiFe—Al$_2$O$_3$—NiFe are particularly preferred for use in the invention.

Concerning GMR layer systems, refer particularly to DE 195 34,856, and for tunnel structures, refer to U.S. Pat. No. 5,650,958 whose disclosure content is completely included in the present application.

The two permanent or ferromagnetic layers 3, 5 are only a few nm thick, as is also the non-magnetic intermediate layer 7. Preferably, the second ferromagnetic layer 5 has an elliptical configuration, while on the other hand, the lower first ferromagnetic layer 3 has a rectangular configuration, or unstructured layers are common to all memory cells. The magnetically harder layer 3 could be arranged on the top in an alternative form of embodiment, and the magnetically softer layer on the bottom. Based on the magnetic shape anisotropy impressed by the elliptical shape, the magnetization of the elliptically shaped second magnetically softer layer 5 points in the direction of the long axis of the ellipse; i.e., the two magnetizations can be parallel or antiparallel to one another. The layer thickness of intermediate layer 7 makes possible the setting of a predetermined coupling between the two magnetic layers 3, 5, in which, in the present example of embodiment, one is formed magnetically harder than the other, but this is not absolutely necessary for the invention.

By appropriate layer thicknesses, one can achieve a very small coupling between the magnetic layers, so that the anisotropy of the memory cells is essentially determined by the second layer 5.

It is particularly preferred to provide suitable measures so that the magnetization in the first layer no longer changes direction once it is taken, so that the parallel or antiparallel adjustment of the magnetization of the two layers relative to one another is determined only by the alignment of the magnetization in the first layer.

The first layer 3 is thus magnetically harder than the second layer 5.

The most effective measure, to form one of the two layers magnetically harder than the other, consists of forming the layer thicknesses differently for the magnetic layers. If the layer thickness of the first lower layer amounts to approximately 10 nm and that of the second upper layer amounts to only 1 to 2 nm, for example, the coercive field strength of the first layer is clearly smaller than that of the second layer,. by which the magnetization in the second layer can be viewed as invariable or frozen.

Two printed conductors 9, 11 are formed over the uppermost second layer, and these are separated from one another by an isolating layer 13. The two printed conductors 9, 11 are presently arranged at an angle of 90° relative to one another, but not limited thereto, and intersect, as can be seen in FIG. 1b, at point K. Each of the two printed conductors 9, 11 is connected to a device for generating currents or current pulses. Thus the current-producing device 20 is connected with the printed conductor 11 and the current-producing device 22 is connected with the printed conductor 9 by means of lines 24, 26.

By a current or current pulse through printed conductor 9, a magnetic field can be built up perpendicular to the direction of facilitated magnetization and a magnetic field can be constructed parallel to the direction of facilitated magnetization by a current or current pulse through printed conductor 11. The printed conductors of the cells shown intersect at an intersection hinge point K at a right angle, i.e., β=90°. Of course, other arrangements are also conceivable, particularly an arrangement, in which printed conductors, 9, 11 run parallel to one another in the region of the memory cells and the intersection point lies outside the memory cells. This may be advantageous, particularly in the case of very short switching times, from the viewpoint of stability.

Figure 1B:
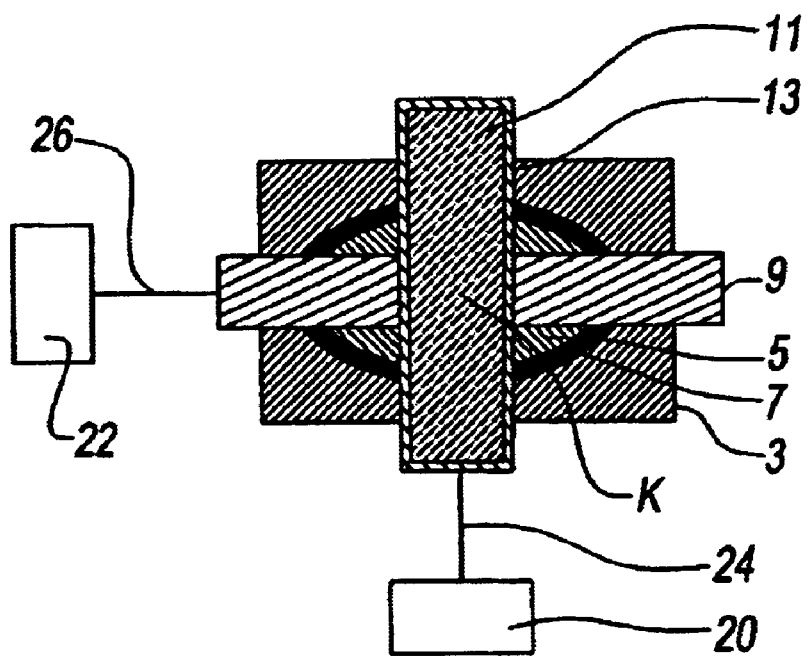
FIG. 1b shows a top view onto a memory cell device according to the invention.
Figure 2:
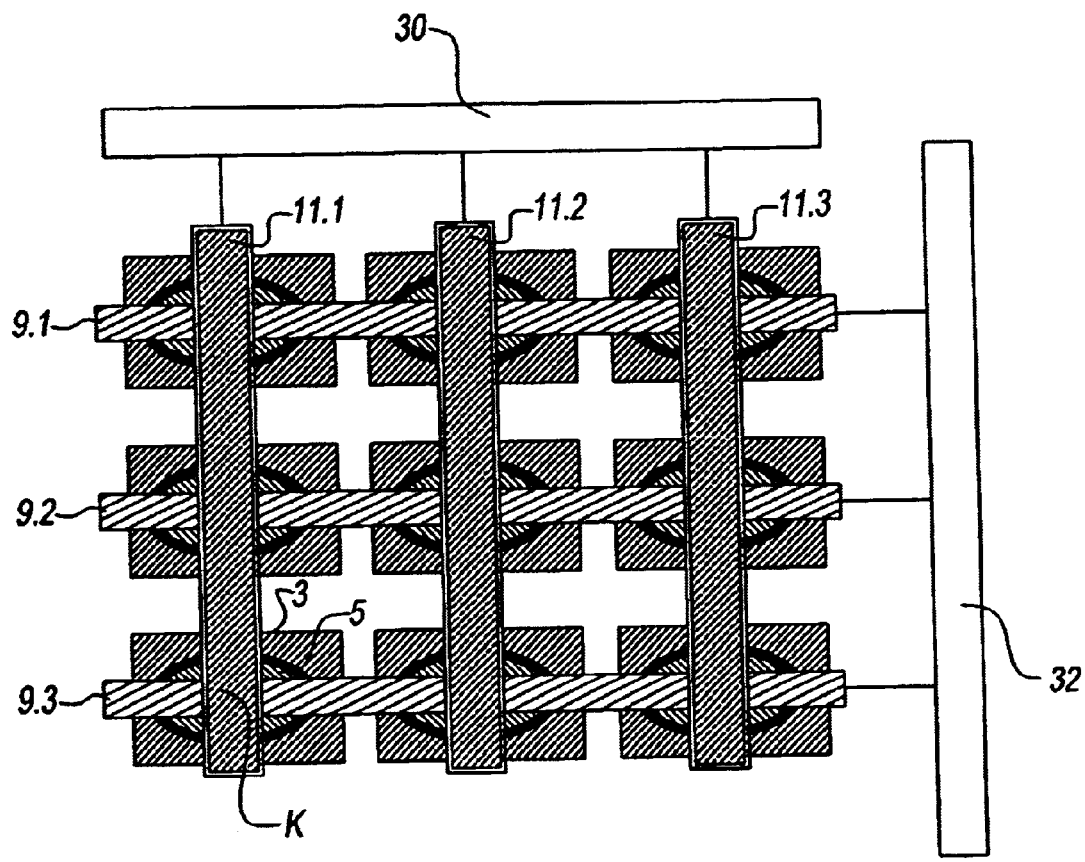
FIG. 2 shows an array of memory cell device[s] according to FIG. 1.

A digital memory device comprised of a multiple number of memory cells according to FIG. 1 is shown in FIG. 2. The individual memory cells are constructed in the form of an array. The array comprises a multiple number of first conductors 11.1, 11.2, 11.3 as well as a multiple number of second conductors 9.1, 9.2 and 9.3, which are perpendicular to each of the first conductors. First and second conductors intersect each time in the region of a memory cell device. The same components as in FIG. 1 for a memory cell device are also given the same reference numbers in FIG. 2.

Each one of the first write conductors 11.1, 11.2 and 11.3 can be controlled by the current pulse device 30; each of the conductors 9.1, 9.2 and 9.3 can be controlled by means of the current pulse device 32. The current pulse devices 30, 32 in turn may be connected with a microprocessor or a central processing unit or CPU. It is the basic concept of the present invention, with the help of means for producing current pulses, to optimize the reversing behavior of a single memory cell device, as shown in FIG. 1, or an entire digital memory device, as shown by an excerpt in FIG. 2, by optimizing the time structure and the intensity of the current pulse on both write conductors. In contrast to the method of the invention, in conventional MRAM memory devices, the addressing of the individual memory cell devices is determined only by the position of the memory cell at the intersection point of the current-carrying conductrs 9, 11. The magnetic field of the conductors is added at intersection point K vectorially and here makes possible the remagnetization. The problem of this method is that the coercive fields of the individual memory cell devices experience a certain scatter based on irregularities, because of which, the response of only a single cell by means of current pulses can only be effected with difficulty on write conductors in the case of very short pulses of less than 10 ns.

In the following, the search for a parameter set suitable for stable switching will be indicated with respect to pulse duration and current intensity.

Figure 3A:
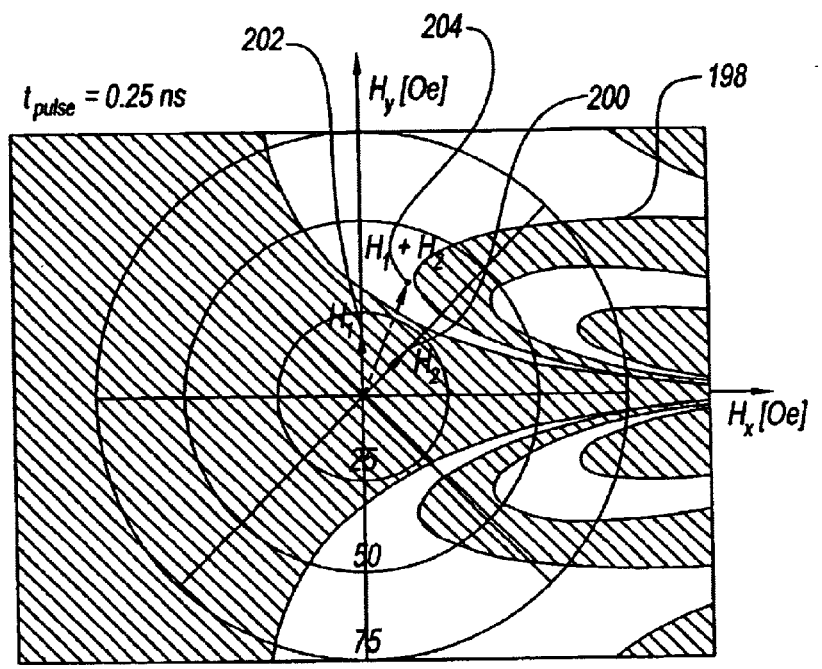
FIGS. 3a–3d show regions of switching and not-switching as a function of pulse duration and field strength for intersecting conductors with $\beta=90°$ or $\beta \approx 45°$.

The two-dimensional representation shown in FIGS. 3a–3d is used for this search. Prior to applying the pulse, the direction of magnetization in the x-direction, could lie i.e., to the left on the x-axis. FIG. 3a now shows whether a switching process has taken place as a function of the direction and intensity of the field pulse. The unshaded regions thus designate regions, in which a switching process has occurred, while the shaded regions indicate regions in which a switching process has not occurred. Each point in FIGS. 3a–3d corresponds to a value of the switching pulse, whereby the direction from the central point to the concrete point indicates the direction of the field pulse in the cell and the distance indicates the intensity of the field pulse. The circles indicate pulses of the same intensity. The regions of stable switching and not-switching shown in FIGS. 3a–3d result for the permalloy material based on the following parameters from the Landau-Lifschitz equation (1):

$4\pi M_s$=10.8 kG, attenuation factor $\alpha$=0.008, $N_x$=0.008, $N_y$=0.012, $N_z$=0.980, i.e., the facilitated axis lies in the x-direction.

Figure 3B:
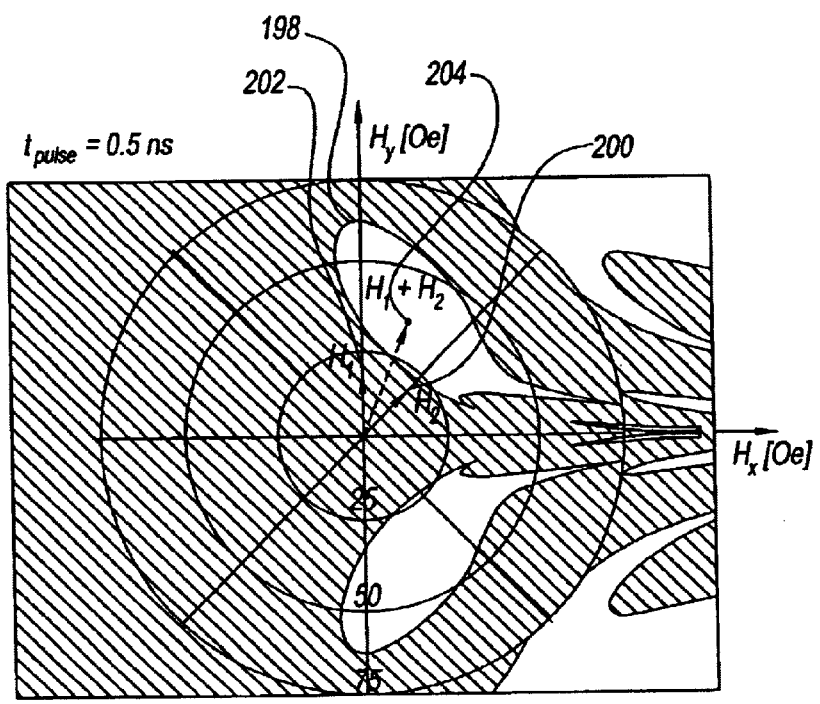
Figure 3C:
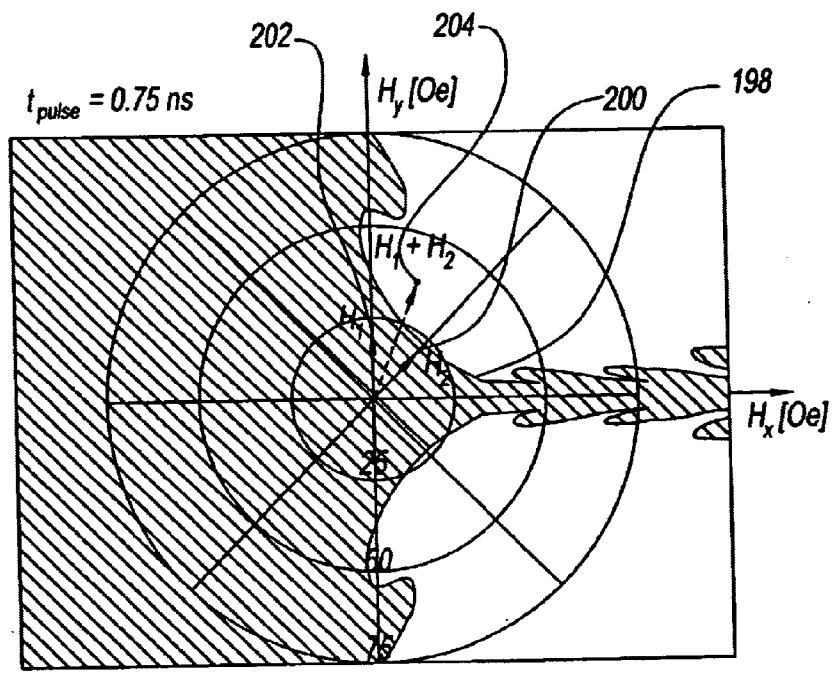
Figure 3D:
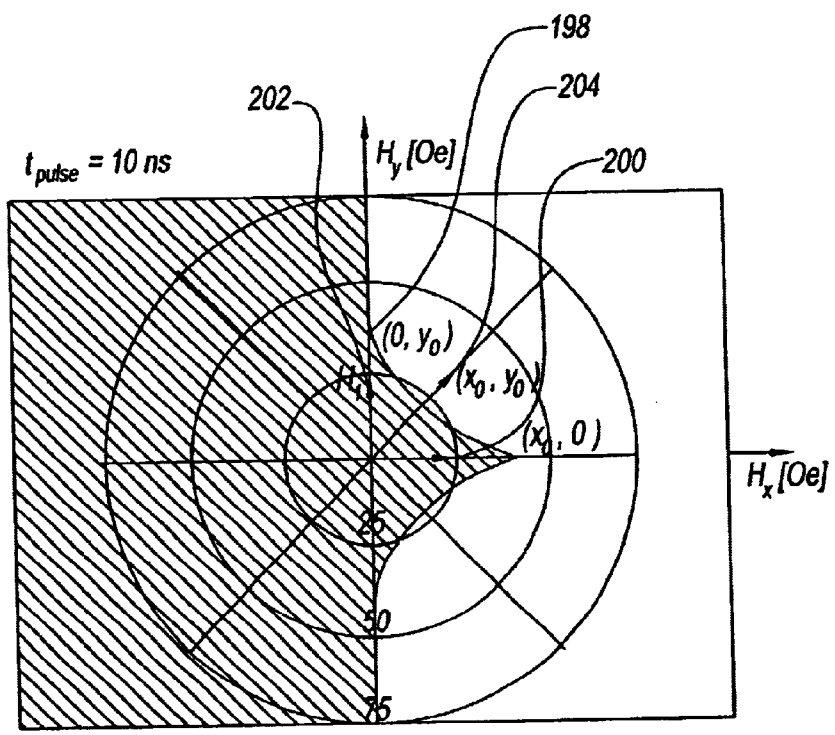

In FIGS. 3a–d, diagrams for a pulse of long duration (t=10 ns) are shown in FIG. 3d and of average duration (t=0.75 ns) are shown in FIG. 3c, and of short duration (t=0.5 ns and t=0.25 ns) in FIGS. 3a and 3b. It can be seen clearly that the separating line or lines 198 between the regions for switching and not-switching are very sensitive to pulse duration.

For a given cell geometry, the possible values at which stable switching occurs can be determined from diagrams as in FIGS. 3a to 3d.

In the following, the case will first be considered that a cell is addressed by means of two intersecting address lines, i.e., each address line produces a magnetic field perpendicular to it, if the line bears current, to all memory cells lying under it. In the addressed memory cell in the intersecting region, the magnetic fields of the two address lines are then added vectorially. For the sake of simplicity, if one now assumes that both address lines intersect at an angle of $\beta$=90°, as shown, for example in FIG. 3d, then the horizontal address line produces a vertical field, for which the switching behavior according to the field intensity can be read out on the y-axis, e.g., for $y_0$. Analogously, for a vertical address line, the switching behavior can be read out on the x-axis, e.g., at $x_0$.

The point $y_o$, the end point of the field is on the horizontal address line and is given the reference number 202, while point $x_0$, the end point of the field on the vertical address line, is given the reference number 200. The switching behavior in the intersecting region can be read off directly for the coordinates ($x_0$, $y_0$), which is designated the end point of the resulting field and is given the reference 204. Stable switching is achieved, if:

(i) the points (±$x_0$, 0) (0, ±$y_0$) lie in the region of non-switching, i.e., pulses applied to the lines lead to memory cells, in which the lines do not intersect, and thus do not reverse the magnetization of the memory cells;

(ii) in the memory cells, in which the lines intersect, the resulting field pulse, which is characterized by the point of switching ($x_0$, $y_0$) leads to the reversal of the magnetization, proceeding from the −x to the +x direction;

(iii) all points (±$x_0$, 0), (0, ±$y_0$) as well as the point of switching ($x_0$, $y_0$) are placed as far removed as possible from the separating line between switching and not-switching.

For long pulses, these conditions are not a problem, as shown in FIG. 3d, but they are problematic for short pulses.

In the present case, the point $x_0$, $y_0$ lies in the switching region (unshaded, bright region) for the pulse durations and current intensities used. For given values of pulse duration and pulse shape, optimal values for the pulse intensities to be set for different pulse durations at which stable switching is produced can be found by means of the above-described method.

While previously, the angle $\beta$ between the intersecting conductors amounted to 90° in the case of the above-described example and in the example described in FIG. 3d, now let the cases be considered below, in which the angle $\beta$ between the address lines is different from 90°. This situation is shown in FIGS. 3a–3c. The angle amounts to approximately 45°. Stable switching is achieved, if, in the diagram, the end points 200, 202 of vectors ±$H_1$, ±$H_2$ (not-switching, black arrows) and the end point 204 of the vector $H_1$ +$H_2$ (switching, dashed arrows) are sufficiently far removed from the separating line 198 between switching and not-switching, and the end points 200, 202 of the vectors ±$H_1$, ±$H_2$ lie in the region of not switching (shaded, dark region) and the point 204 of the vector $H_1$+$H_2$ lies in the region of switching (not shaded, bright regions).

[Corrected sheet (Regulation 91) ISA/EP—given at the bottom of German page 19—Translator's note.]

Figure 3E:
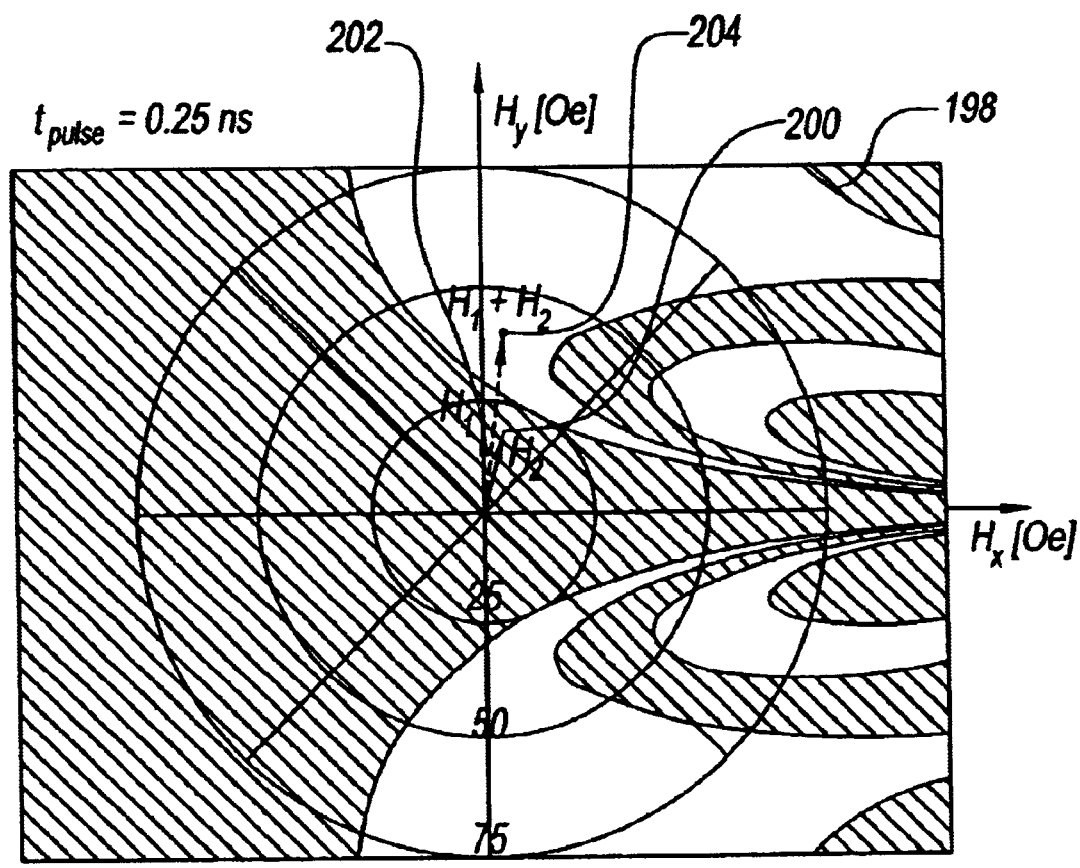
FIG. 3e shows regions of stable switching for a pulse duration of t=0.25 ns and parallel address lines.

It is also possible to reverse the respective state of magnetization by means of rectified field pulses. This is shown in FIG. 3e. Here, the two address lines run parallel in the region of the addressed memory cells. The end points 200, 202 of the vectors ±$H_1$, ±$H_2$ (not-switching) and the end point 204 $H_1$+$H_2$ (switching) are noted, whereby now $H_1$ and $H_2$ lie nearly parallel to one another. It can be seen directly in FIG. 3e that for short pulse durations of t=0.25 ns, a very stable switching to the reversed state each time can be achieved with such an arrangement, whereby in turn, the condition of a sufficient distance from the separating line between switching and not-switching is maintained.

As shown on the basis of FIGS. 3a–3e, by suitable selection of the pulse duration, the pulse intensity as well as angle $\beta$ of the address lines relative to one another, stable switching can be achieved with short pulse durations, since the precession for the end of the pulse is successfully suppressed.

The temporal evolution of the different magnetization components $m_x$, $m_y$, $m_z$ is shown in the following FIGS. 4a–e and 5a–e for different places in a two-dimensional diagram, as is the basis of FIGS. 3a–e. In the diagrams, $m_x$, $m_y$, $m_z$ designate the magnetization $M_x$, $M_y$, $M_z$ standardized to the saturation magnetization $M_s$ of the considered layer, in the present case, a permalloy layer.

In the example of embodiment according to FIGS. 4a–4e, the field pulse is a square pulse of 2.75 ns duration. Prior to applying the field pulse, the magnetization is aligned in the x-direction. The unshaded regions in FIG. 4a designate the field of successful switching of magnetization to the +x-direction. The circular coordinate system in FIG. 4a makes possible the establishment of the intensity and direction of the field pulse. The intensity of the pulse in the center is 0; the distance of the adjacent circles of the coordinate system amounts to 25 Oe. The four diagrams 4b–e show the temporal evolution of the magnetization $m_x$, $m_y$, $m_z$ as a function of the position of the resulting field pulse in diagram 4a. At all pulses, one observes at the beginning and at the end of the field pulse an intense ringing; i.e., decays of the magnetization. As can be seen from FIGS. 4a–e, in the case of smaller intensities of the resulting field pulse, switching is in no way achieved.

Figure 4A:
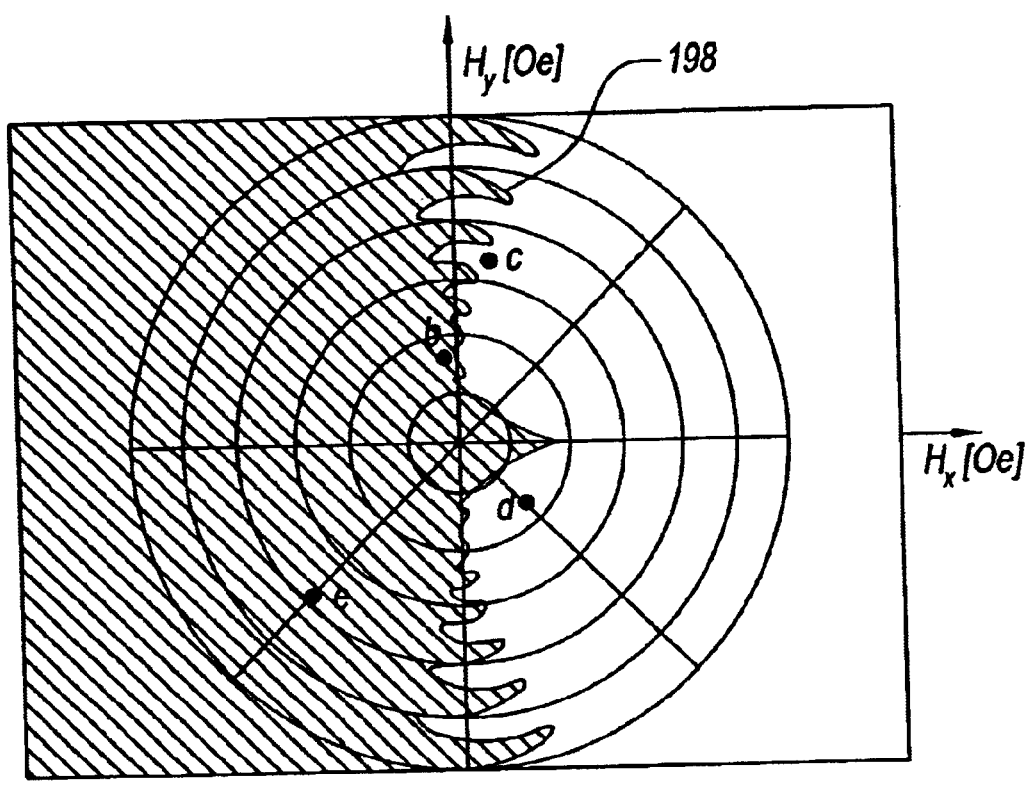
FIGS. 4a–4e show regions of switching and not-switching for square pulses with t=2.75 ns.
Figure 4B:
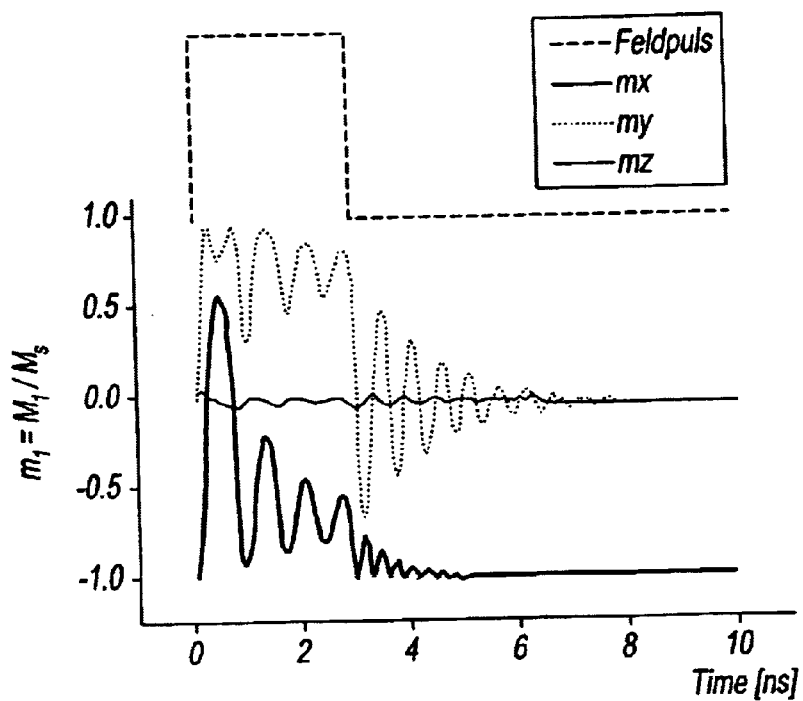
Figure 4C:
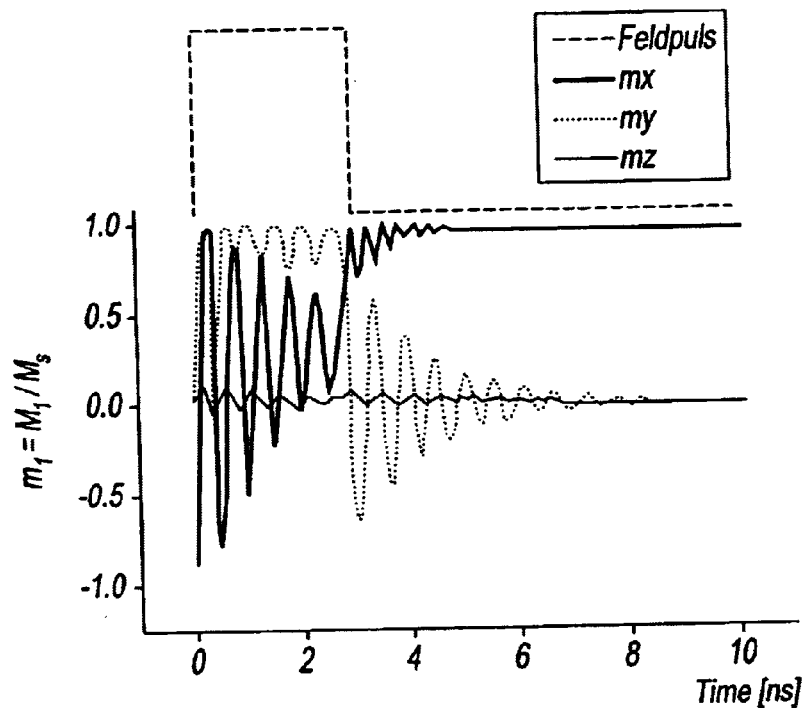
Figure 4D:
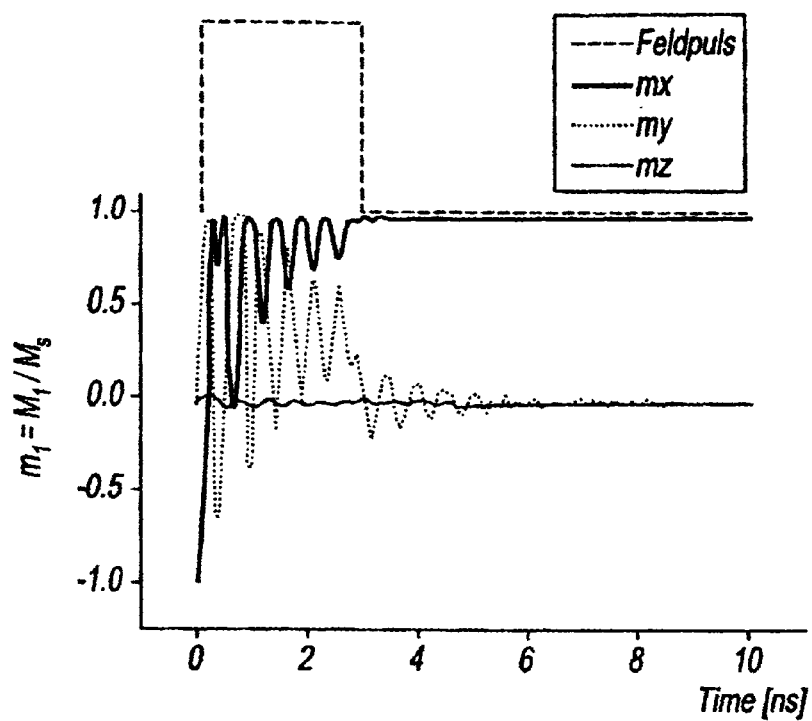

The intensity and direction of the resulting field pulse is designated by the letters b, c, d, e in diagram 4a for the different cases presented in FIGS. 4b–e. In the cases of FIG. 4c, 4d, a reversing of the magnetization from the −x to the +x-direction occurs; in the cases of FIG. 4b, 4e no reversing occurs.

Figure 5A:
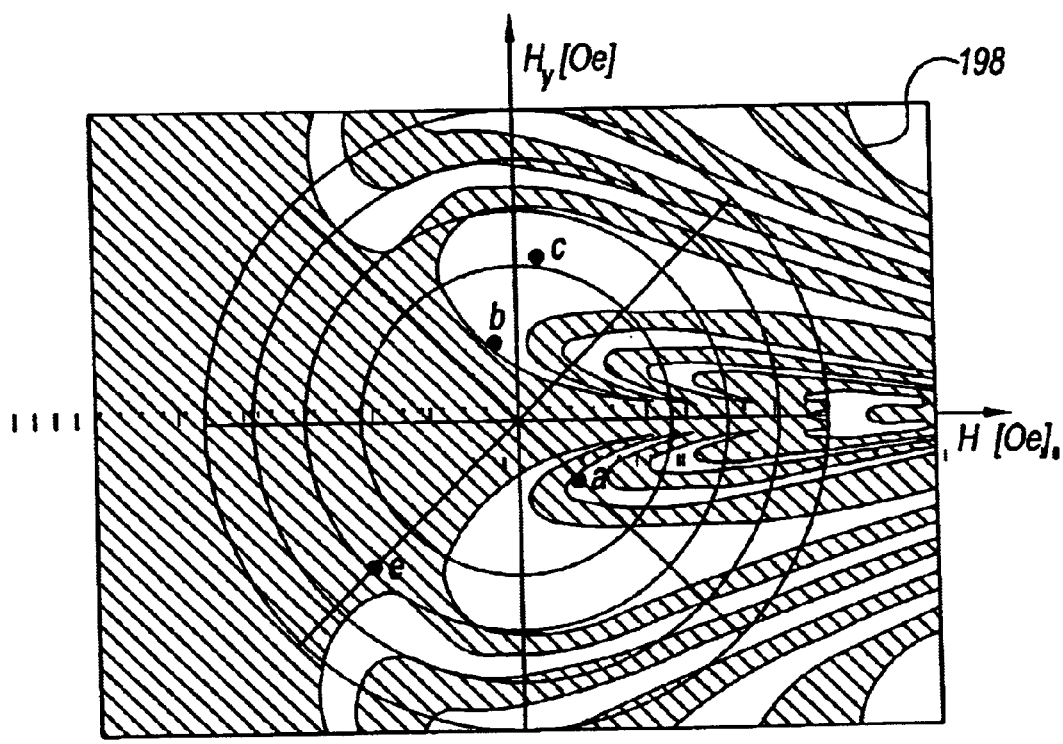
FIGS. 5a–5e show regions of switching and not-switching for square pulses with t=0.25 ns.
Figure 5B:
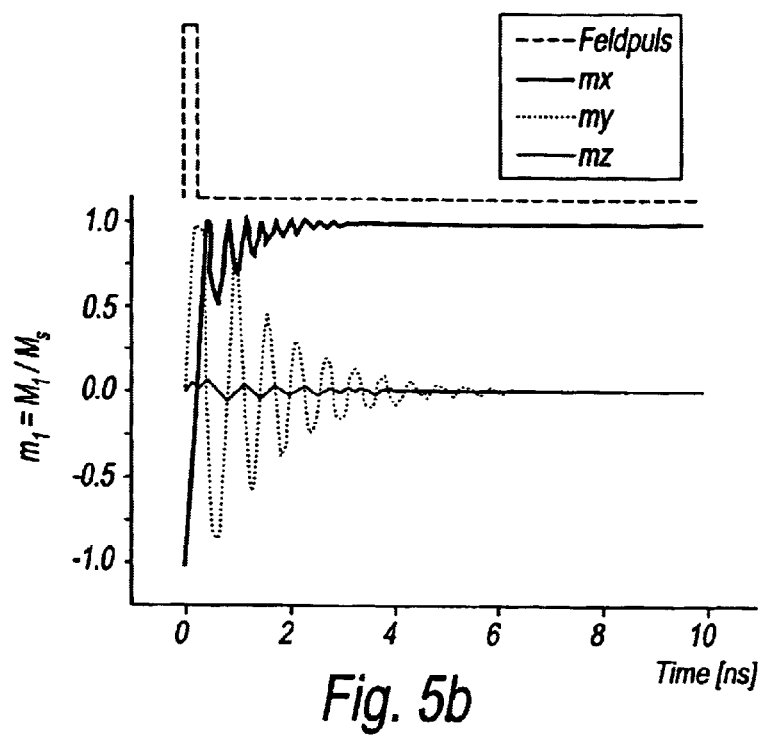

In FIGS. 5a–e, the temporal evolution of the magnetization $m_x$, $m_y$, $m_z$ for short switching pulses of 0.25 ns pulse duration is shown. The two-dimensional representation for the resulting field pulse in FIG. 5a shows a completely different form than for the case of longer pulses of 2.75 ns duration according to FIG. 4a.

In particular, switching is also possible with resulting field pulses, which point in the direction of magnetization in the unswitched state, i.e., in the −x direction.

Figure 4E:
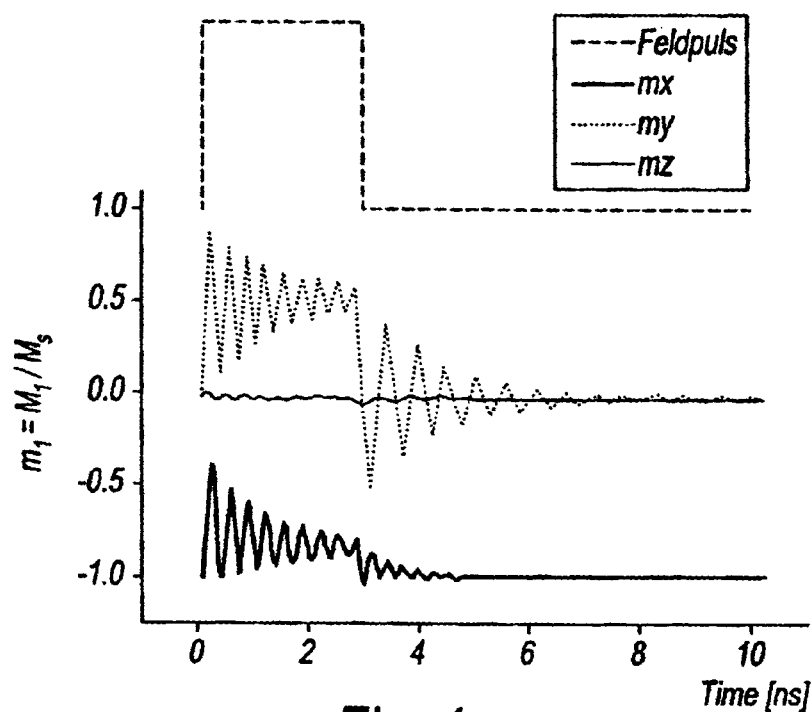
Figure 5C:
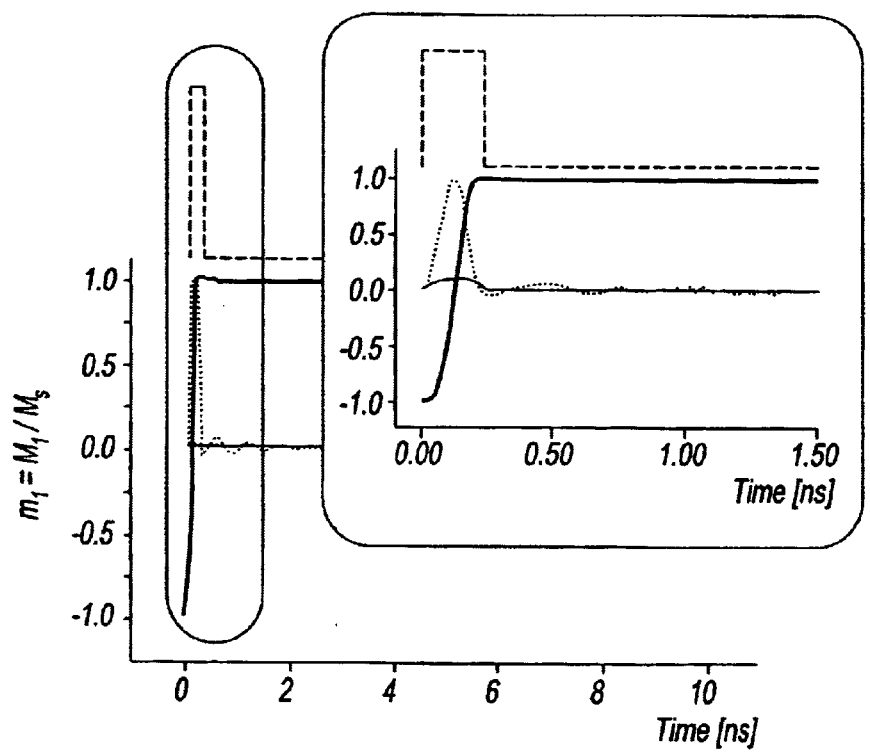
Figure 5D:
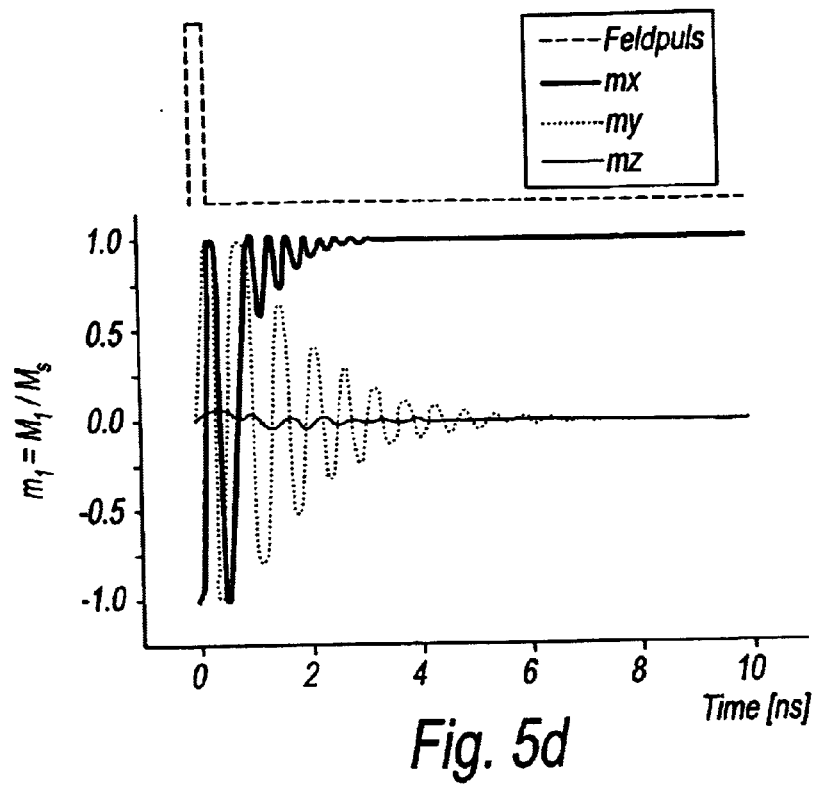
Figure 5E:
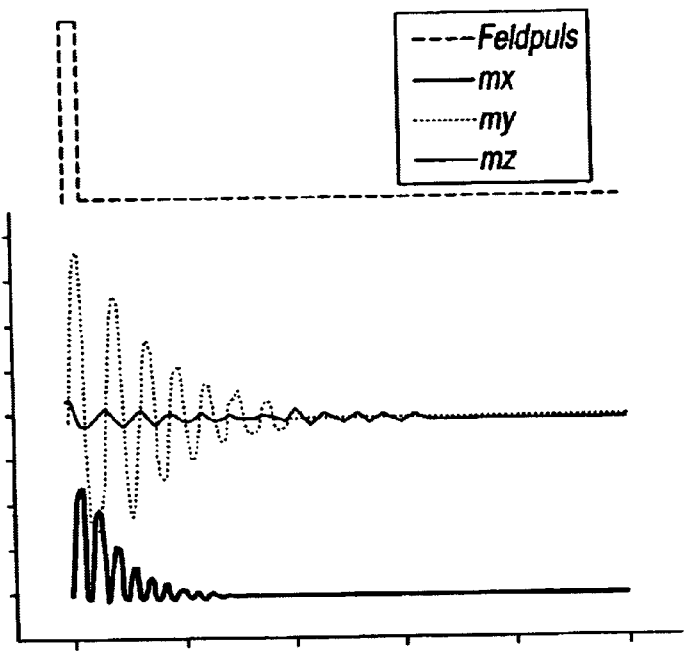

In the cases of FIGS. 5c–5e, the final state of the magnetization is analogous to the cases of FIGS. 4c–4e. In contrast to the case of FIG. 4b, switching does occur according to FIG. 5b. This can be attributed to the fact that the switching process with short pulse lengths of 0.2–0.6 ns is dominated by precession. FIG. 5c particularly shows how this behavior can be effected. A complete reversal of magnetization within the pulse duration can be observed, whereby no "ringing" occurs. The magnetization reverses on a time scale, which is essentially shorter than the relaxation time of the magnetization. The reason for this behavior can be seen from the fact that the resulting field pulse then decreases precisely to 0, i.e., it is switched off, if the z-component of the magnetization passes 0. This is advantageous from an energy viewpoint, since at this point the Zeeman energy, which is taken from the field, is maximal.

Figure 6A:
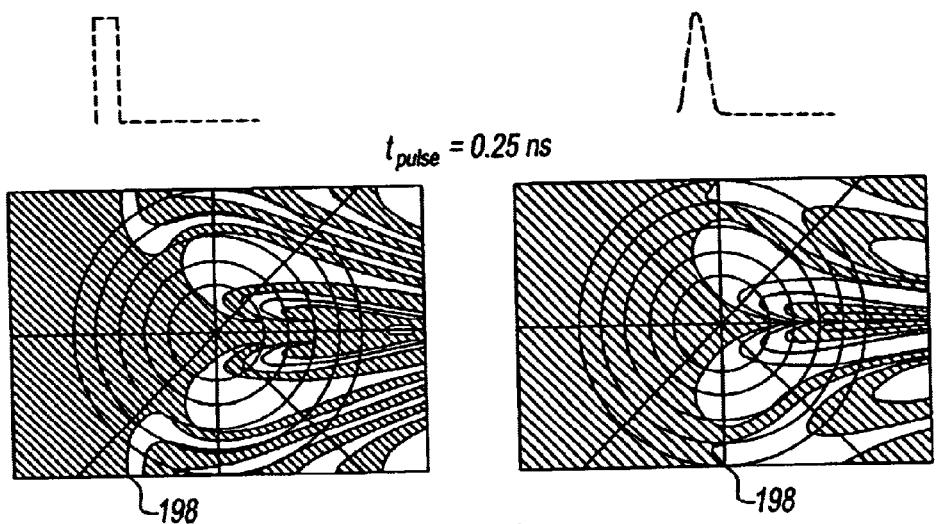
FIGS. 6a–6c show regions of switching and not-switching for different pulse shapes and pulse durations.
Figure 6B:
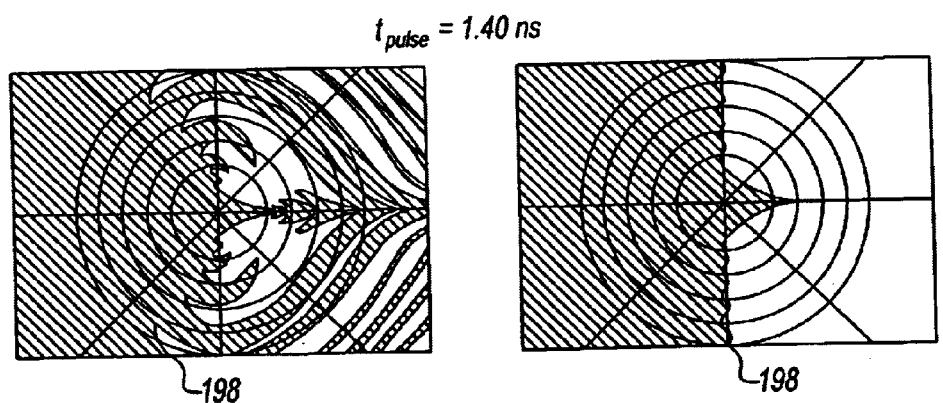
Figure 6C:
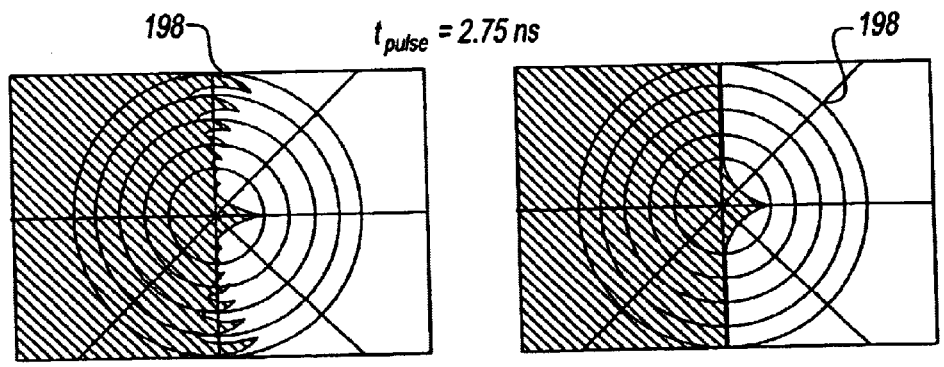

For an ultrarapid switching, it is particularly advantageous, if a "ringing" can be completely suppressed as in the case of FIG. 6c, since the dead time is id then minimal. This permits a rapid and complete back-and-forth switching of a memory cell between the magnetization states to the +x and −x directions in switching pulses that directly follow one another.

FIGS. 6a–6c show the influence of pulse shape on the separating line 198 of the region of switching or not-switching. The magnetization prior to switching lies in the −x direction, as in all of the previous two-dimensional representations. It is switched from the −x direction to the +x direction. The left side shows the regions of switching/not-switching for the square pulse shape; the right side shows the regions of switching/not-switching for a pulse with a rising edge and a falling edge.

The pulse time amounts to 0.25 ns in FIG. 6a; the process is dominated by precession.

FIG. 6b shows the transition region with a pulse duration of 1.40 ns.

FIG. 6c finally shows the region with a pulse duration of 2.75 ns, dominated by the attenuation.

The reversal behavior by means of the current pulse according to the invention will be illustrated below in still more detail on the basis of FIGS. 7 to 10.

Figure 7:
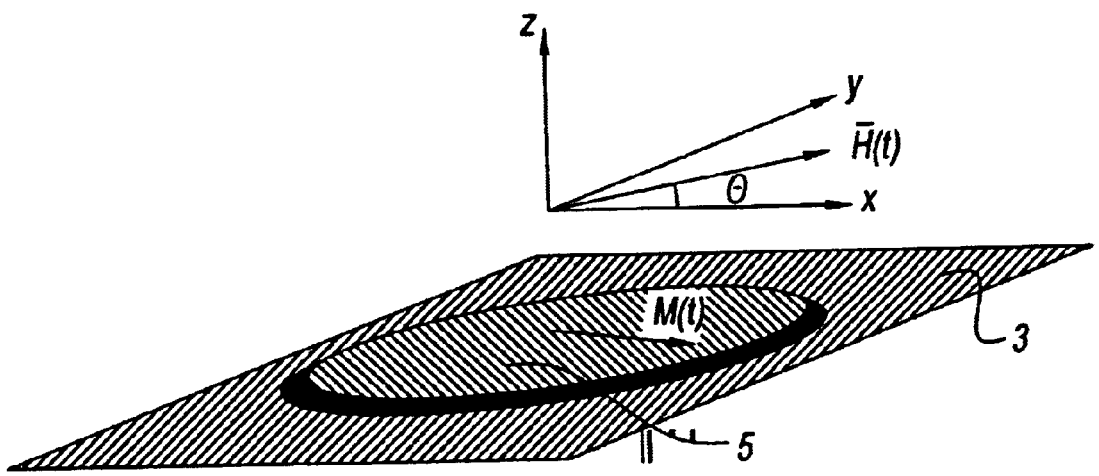
FIG. 7 shows a section through a memory cell according to the invention with indication of a coordinate system.
Figure 8A:
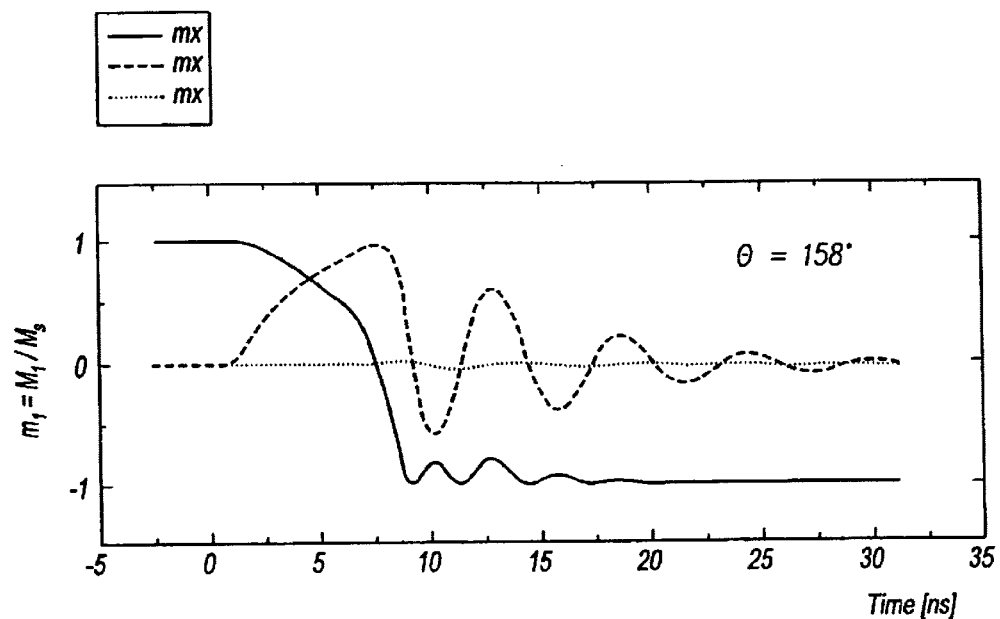
FIGS. 8a, 8b show the course of magnetization in the different coordinate axes when unipolar pulses of different current intensity are applied, resulting in a different angle θ.
Figure 8B:
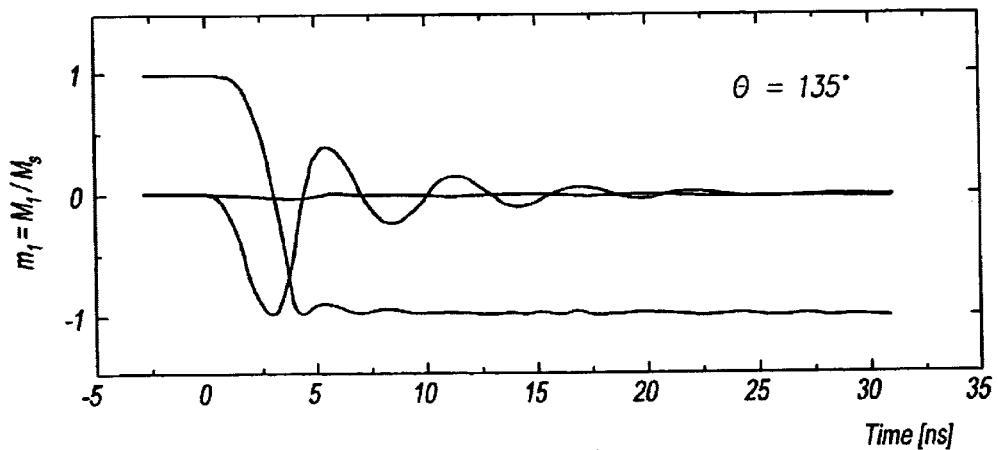
Figure 9A:
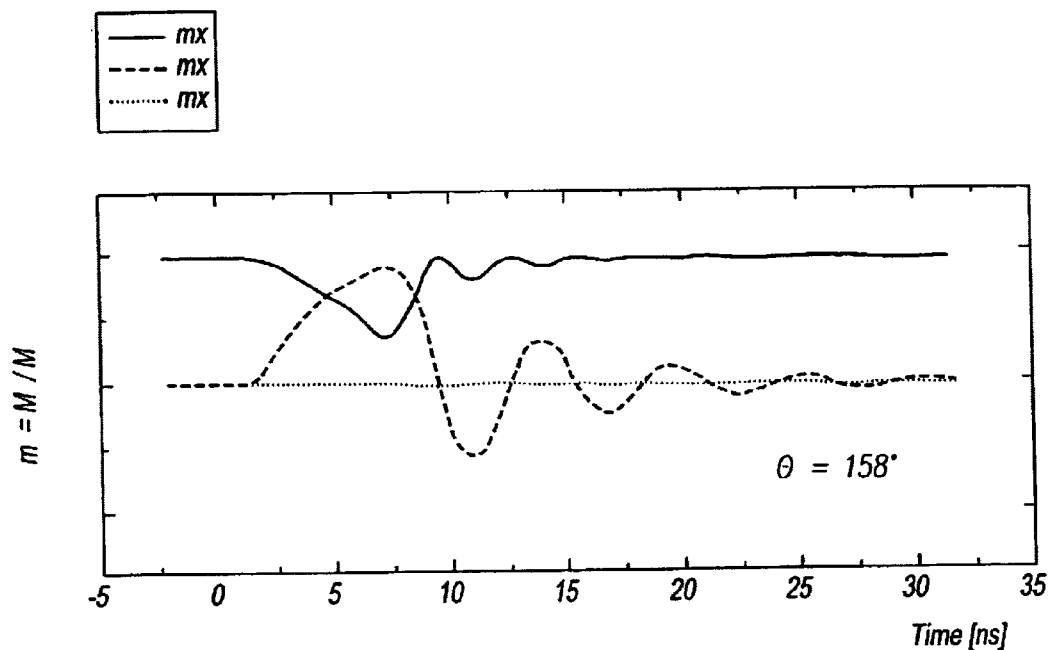
FIGS. 9a, 9b show the course of magnetization in the solid angle θ present and different time durations of the unipolar pulse.
Figure 9B:
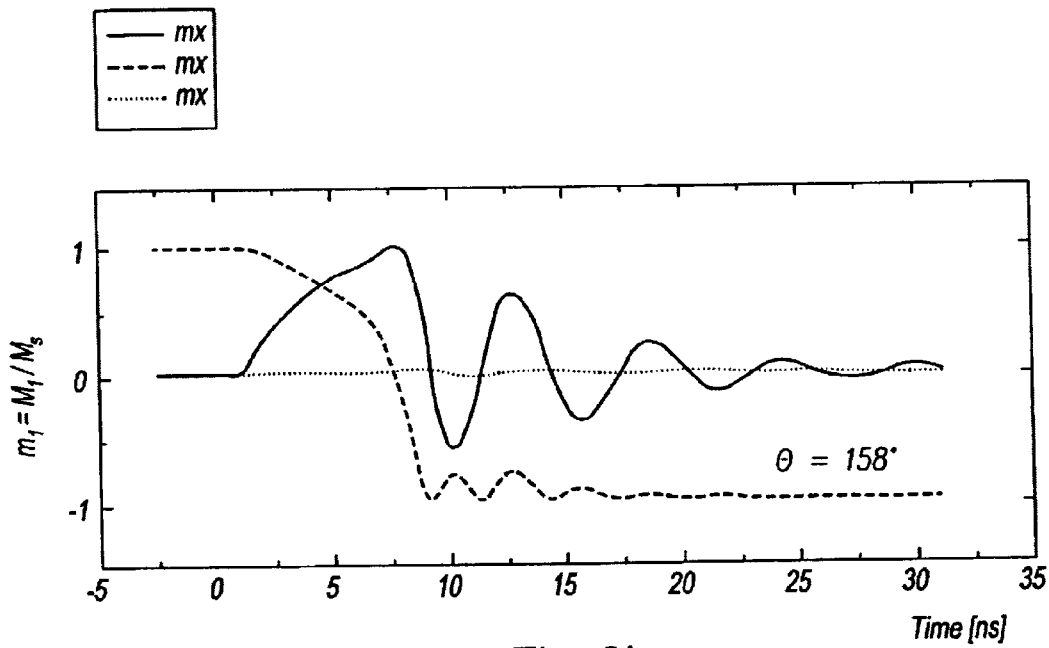

FIG. 7 shows the parameters used in FIGS. 8 to 9, on the basis of a sectional image through a memory cell device.

The memory cell device in turn comprises a first magnetic layer 3 as well as an elliptical second magnetic layer 5. The direction of facilitated magnetization of the anisotropic second magnetic layer runs along the longitudinal axis of the ellipse, hence in the depicted coordinate system, along the x-axis H(t).

The direction perpendicular to the facilitated direction of magnetization is represented by the y-axis, and that perpendicular to all of the memory cells by the z-direction.

The magnetic field H(t) indicated in FIG. 7 is produced by the current pulse on the write conductors 9, 11, and this field is comprised of a component parallel to the facilitated direction of magnetization $H_p$ (t) and a component perpendicular to the facilitated direction of magnetization $H_s$ (t).

The resulting magnetic field H(t) has an angle θ between magnetic field and facilitated direction of magnetization. In the two-dimensional diagrams of the previously described FIGS. 4–7, this was the angle between the resulting vector of the field pulse in the memory cell, in which the conductors intersect and the x-axis, which coincides with the facilitated direction of magnetization in these examples.

Due to the time-dependent magnetic field, a time-dependent course of the magnetization m(t) results, which can in turn be cleaved into components $m_x(t)$, $m_y(t)$, $m_z(t)$, as was described above in detail.

In FIG. 8, the course of the magnetization is cleaved into the three normalized components $m_x$, $m_y$, $m_z$ as a function of angle θ, which encloses the applied field H(t) with the facilitated direction of magnetization. As can be clearly recognized, the reversing of a first alignment, for example, parallel alignment of the magnetization with the standardized value 1 to an antiparallel alignment of the magnetization with a standardized value −1 is achieved essentially more rapidly each time in the x-component of the magnetization for an angle of θ=135° than for an angle of 158°.

In the first case, the time duration of the pulse for the directions parallel and perpendicular to the facilitated direction of magnetization amounted to 12.4 ns, the field intensity $H_p$ was −0.005, i.e., −0.5% of the saturation magnetization of the soft layer, and the field strength $H_s$ was 0.002, i.e., 0.2% of the saturation magnetization of the soft layer.

In the example shown in FIG. 8b, the field strength $H_p$ amounted to −0.005 and the field strength $H_p$ was 0.005 producing an angle θ of 135°. The pulse duration of the unipolar pulses both parallel as well as perpendicular to the faciliated direction of magnetization amounted to 5 ns. It can be clearly recognized that the reversal of the memory cell is almost twice as fast with an angle of θ=135° than θ=158°.

In FIG. 9, the angle θ=158° was established based on the ratio of the current intensities of the magnetic fields parallel and perpendicular to the facilitated magnetization. The magnetic field strength $H_p$ amounted to −0.005 and the magnetic field strength $H_s$=0.002, According to FIG. 9a, the pulse duration of the unipolar pulses both perpendicular and parallel to the facilitated direction of magnetization amounted to 6.2 ns. As can be clearly seen, this pulse duration is insufficient in order to reverse the magnetization $m_x$ from the parallel state 1 to the antiparallel state −1. An essentially longer time duration is necessary for this, as is shown in FIG. 6d. A reversal is achieved, if the pulse duration, as shown in FIG. 6d, amounts to 12.4 ns for both the direction perpendicular as well as the direction parallel to the facilitated direction of magnetization.

As can be clearly recognized from this, for the pregiven angle θ, a selection or addressing of only individual memory regions can be achieved, due to the fact that pulse durations are selected correspondingly.

Figure 10A:
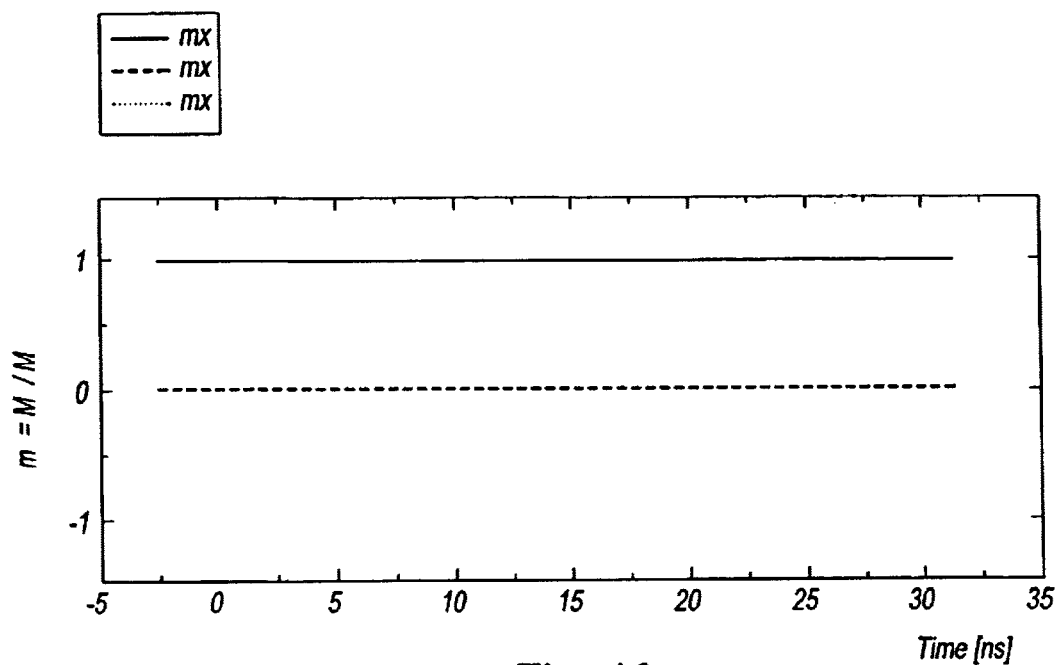
FIGS. 10a, 10b show the course of magnetization in memory cells adjacent to the addressed memory cells with intersecting conductors.
Figure 10B:
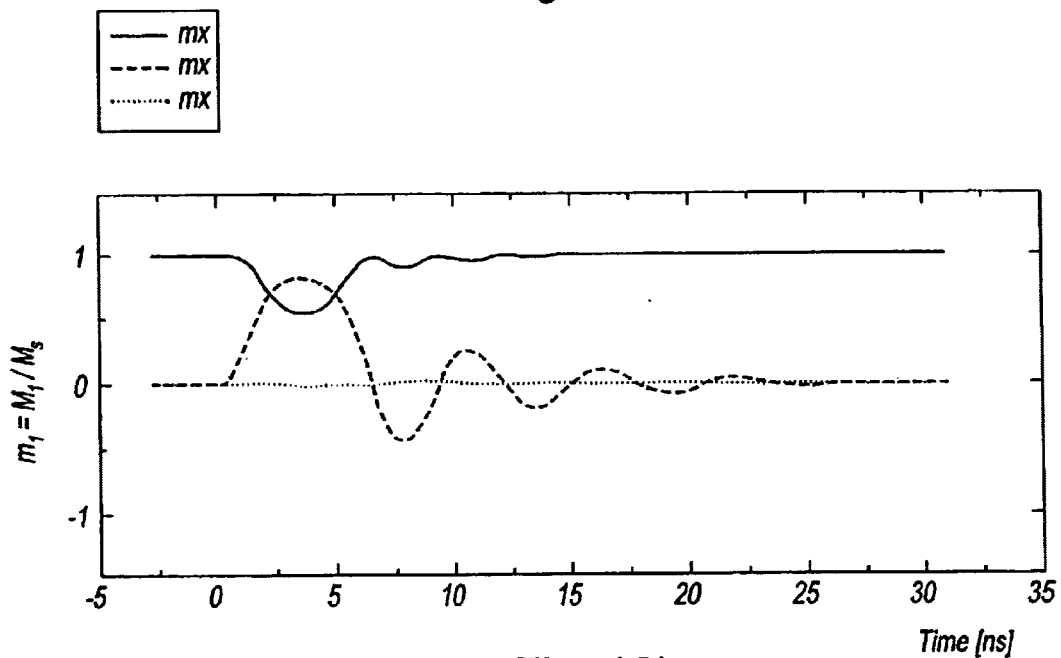

As proceeds from FIGS. 10a and 10b, in the method of the invention only those memory cells are addressed, in which the current-conducting conductors intersect. Adjacent memory cells, through which a current is in fact conducted through one of the conductors, remain uninfluenced, since there, the parameter combination of field, field direction and time make the remagnetization impossible. In FIG. 10a, the angle θ=180°, i.e., a magnetic field is applied only parallel to the facilitated direction of magnetization, i.e, $H_p=-0.005$, $H_s=0$. A pulse of $T_s=T_p=5$ ns has no influence on the components $m_x$, $m_y$, $m_z$.

In FIG. 10b, the course of the magnetization $m_x$, $m_y$, $m_z$ is shown for a current pulse, which constructs a magnetic field perpendicular to the facilitated direction of magnetization, thus in which $\theta=90°$. The pulse duration amounts to $T_s=T_p=5$ ns, $H_p=0$, $H_s=0.005$. After a certain time duration of 25 ns, the magnetizations there are also again achieved at a time point prior to the occurrence of the current pulse, and a reversal of the $M_x$ component does not occur as it does in the region in which the current-conducting lines intersect. All of the previously given field data refer to the saturation magnetization of the softer layer 5, wherein for example, −0.005 indicates −0.5% and 0.002 indicates 0.2% of the saturation magnetization of the softer layer 5.

Thus, with the method of the invention, a method is indicated for the first time, with which magnetic memory cells can be addressed reliably and without influencing adjacent cells in a digital magnetic memory array, based on individual pulses and suitable selection of the same in proportion to current intensity as well as pulse duration. Rapid reversal times of less than 10 ns, preferably less than 5 ns, are realized hereby, with very low current settings. Simultaneously, in a particularly advantageous configuration of the invention, the duration of the current pulse can be selected such that the power consumption necessary for reversal is minimized.

What is claimed is:

1. A digital magnetic memory cell device for reading and/or writing operations comprising:
    a first and a second magnetic layer, each having a magnetization that is aligned parallel or anti-parallel relative to one another for the storage of digital information, wherein at least said first magnetic layer exhibits a magnetic anisotropy;
    an intermediate layer disposed between the first and the second magnetic layers;
    at least two intersecting printed conductors that conduct reading and writing currents and that intersect in an intersection region of said first and second magnetic layers to thereby define a memory cell;
    means for reversing the magnetization of at least one of the first and second magnetic layers from a parallel to an anti-parallel alignment and vice versa, wherein the means for reversing comprises device means for producing said reading and writing currents on first and second printed conductors, which comprise said at least two intersecting printed conductors;
    wherein the first and second printed conductors intersect at a predetermined angle β and wherein said reading and/or writing currents have a pulse duration <10 ns under the following conditions:
        a set of points, $(\pm x_0,0),(0,\pm y_0)$, are located in non-switching regions, in which the reading and/or writing currents that are applied to the first and second printed conductors lead to no reversing of the magnetization of the first and second magnetic layers outside said memory cell;
        a resulting field pulse, which is characterized by a switching point $(x_0,y_0)$, leads to reversal of the magnetization in said memory cell;
        all points $(\pm x_0,0),(0,+y_0)$ and the switching point $(x_0, y_0)$ are placed as far distant as possible from a separating line between said memory cell and said non-switching regions;
    whereby a complete and reliable reversal of the magnetization from a parallel alignment to an anti-parallel alignment and vice versa is achieved in said memory cell.

2. The digital magnetic memory cell device in accordance with claim 1, wherein the angle β=90°, so that the first and second printed conductors are oriented perpendicularly to one another.

3. The digital magnetic memory cell device in accordance with claim 1, wherein the angle β is selected from the following range: 0<β<90°.

4. The digital magnetic memory cell device in accordance with claim 1, wherein the intersecting printed conductors run parallel to one another in at least one segment part.

5. The digital magnetic memory cell device in accordance with claim 1, wherein the ratio of the intensity of the currents produced in the first and second printed conductors relative to one another is set in such a way that, in order to reverse the magnetization, the magnetic field has a predetermined angle θ relative to the facilitated direction of magnetization of the first magnetic layer.

6. The digital magnetic memory cell device in accordance with claim 5, wherein a bipolar current pulse is applied to one of the first and second printed conductors, wherein the bipolar current pulse produces a magnetic field perpendicular to the facilitated direction of magnetization, and a static current or a current pulse is applied to the other of the first and second printed conductors.

7. The digital magnetic memory cell device in accordance with claim 1, wherein the reading and writing currents are unipolar pulses.

8. The digital magnetic memory cell device in accordance with claim 1, wherein the anisotropic first magnetic layer has a uniaxial magnetic anisotropy as a result of a growth process and/or shape-related anisotropy.

9. The digital magnetic memory cell device in accordance with claim 1, wherein one of the first and second magnetic layers is magnetically harder than the other magnetic layer.

10. A The digital magnetic memory cell device in accordance with claim 1, wherein a plurality of printed conductors are connected with said at least two printed conductors of each memory cell device.

11. The digital Magnetic memory cell device in accordance with claim 10, wherein in each of said magnetic memory cell devices the ratio of the intensity of the currents produced in he first and second printed conductors relative to one another is set in such a way that, in order to reverse the magnetization, the magnetic field has a predetermined angle θ relative to a facilitated direction of magnetization of the first magnetic layer, wherein the duration of the reading and writing currents is less than 10 ns end wherein the ratio of the intensity of the reading and writing currents that gives rise to the angle θ is selected in such a way that a complete reversing of magnetization takes place in a single pregiven one of the plurality of magnetic memory cell devices without influencing the magnetization state of others of said plurality of magnetic memory cell devices that are neighbors of said pregiven one magnetic memory cell device.

12. The digital magnetic memory cell device in accordance with claim 10, wherein the durations of the reading and writing currents are additionally selected in such a way that a complete reversing of magnetization is achieved simultaneously with a minimum power consumption.

13. The digital magnetic memory cell device in accordance with claim 10, wherein the plurality of magnetic memory cell devices is arranged in matrix form.

14. The digital magnetic memory cell device in accordance with claim 10, wherein a common means for reversing is assigned to said plurality of printed conductors, which are arranged in rows and/or columns, and wherein said magnetic memory cell devices are arranged in matrix form.

15. The digital magnetic memory cell device in accordance with claim 10, wherein the magnetically harder layer is a layer that passes over said plurality of magnetic memory cells.

16. A method for reading/writing digital information to a digital memory cell device by changing the orientation of the magnetization in one of first and second magnetic layers relative to one another, wherein the first and second magnetic layers each have a magnetization that is aligned parallel or anti-parallel relative to one another, an intermediate layer disposed between the first and the second magnetic layers and at least two intersecting printed conductors that conduct reading and writing currents and that intersect in an intersection region to thereby define a memory cell, said method comprising:

applying said reading and writing currents to the intersecting printed conductors, wherein each of the reading and writing currents has a pulse duration shorter than 10 ns, and wherein a magnetic field is built up in the intersection region at an angle θ opposite a direction of facilitated magnetization under the following conditions:
 (i) a set of points, $(\pm x_0, 0), (0, \pm y_0)$, is located in non-switching regions, in which the reading and writing currents that are applied to the at least two printed conductors lead to no reversing of the magnetization of the first and second magnetic layers outside of said memory cell;
 (ii) a resulting field pulse, which is characterized by a switching point $(x_0, y_0)$, leads to reversal of the magnetization in said memory cell;
 (iii) all points $(\pm x_0, 0), (0, \pm y_0)$ and the switching point $(x_0, y_0)$ are placed as far distant as possible from a separating line between said memory cell and said non-switching regions;
whereby a relative orientation of the magnetization is changed and a complete and reliable reversing of the magnetization from a parallel alignment to an anti-parallel alignment is achieved in said memory cell.

17. The method in accordance with claim 16, wherein a predetermined angle θ is set opposite a direction of a facilitated magnetization by a ratio of the current intensities of the reading and writing currents, relative to one another.

18. The method in accordance with claim 17, wherein the reading or writing current on one of the at least two printed conductors, in which the current flux produces a magnetic field perpendicular to the facilitated direction of magnetization, is a bipolar current pulse and a static current or current pulse is applied to the other of the at least two printed conductors.

19. The method in accordance with claim 18, wherein the time duration of the reading or writing current on the other of the at least two printed conductors is longer than the duration of a half-wave of the bipolar current pulse.

20. The method in accordance with claim 16, wherein the reading and writing currents are unipolar pulses.

21. The method in accordance with claim 16, wherein the pulse durations of the reading and writing currents are additionally selected in such a way that a complete reversing of the magnetization is achieved with a minimum power consumption.

22. The method in accordance with claim 16, wherein said magnetic memory device is one of a plurality of substantially identical magnetic memory devices, and further comprising:

selecting one of said plurality of magnetic memory devices by applying said reading or writing currents to the at least two intersecting printed conductors thereof, whereby digital information is written to or read from said selected magnetic memory cell without influencing the magnetization of other magnetic memory cells of said plurality of magnetic memory cells adjacent thereto.

\* \* \* \* \*